United States Patent [19]

Huber

[11] Patent Number: 5,285,010
[45] Date of Patent: Feb. 8, 1994

[54] ELECTRICAL CONTROL DEVICE WITH METAL-COATED PLASTIC HOUSING

[75] Inventor: Elmar Huber, Reutlingen, Fed. Rep. of Germany

[73] Assignee: Robert Bosch GmbH, Stuttgart, Fed. Rep. of Germany

[21] Appl. No.: 976,444

[22] Filed: Nov. 13, 1992

[30] Foreign Application Priority Data

Dec. 20, 1991 [DE] Fed. Rep. of Germany ....... 4142138

[51] Int. Cl.$^5$ ............................ H05K 5/00; H05K 1/14
[52] U.S. Cl. .................................... 174/52.1; 361/736; 361/752
[58] Field of Search ................. 174/52.1, 52.2, 52.3, 174/52.4, 262; 361/390, 392, 393, 394, 395, 397, 399, 400, 401, 402, 415, 413

[56] References Cited

U.S. PATENT DOCUMENTS

| 4,495,232 | 1/1985 | Bauser et al. ............... 428/41 |
| 4,831,495 | 5/1989 | Harding ..................... 174/52.4 |
| 5,006,922 | 4/1991 | McShane et al. ............. 361/400 |

FOREIGN PATENT DOCUMENTS

| 0006334 | 1/1980 | European Pat. Off. . |
| 0063347 | 10/1982 | European Pat. Off. . |
| 0151413 | 8/1985 | European Pat. Off. . |
| 0260681 | 3/1988 | European Pat. Off. . |
| 0359606 | 3/1990 | European Pat. Off. . |
| 7933068 | 2/1980 | Fed. Rep. of Germany . |
| 3020902 | 12/1981 | Fed. Rep. of Germany ..... 174/52.1 |
| 3345701 | 6/1985 | Fed. Rep. of Germany . |
| 4037603 | 5/1991 | Fed. Rep. of Germany . |
| 4005113 | 8/1991 | Fed. Rep. of Germany . |
| 3-14295 | 1/1991 | Japan .................... 174/52.1 |

Primary Examiner—Leo P. Picard
Assistant Examiner—Bot Ledynh
Attorney, Agent, or Firm—Frishauf, Holtz, Goodman & Woodward

[57] ABSTRACT

In a control device (11), the strip conductors (29) are applied to the interior wall (28) of the housing (15), consisting of plastic, with integrated plugs (16) with the aid of novel deposition processes. In this case the laser-assisted deposition process or the Ivonding ® process can be used in a particularly advantageous manner. It is possible by means of these types of manufacture to dispose the plug connectors (24) in a simple manner in a through-bore (23) in the housing (15) and to connect them directly with the strip conductors (29) on the interior wall (28). Bonded connections (31) for connecting hybrid circuits (13), for example, can be attached in a simple manner at the other end of the strip conductors (29). Because of this, it is possible to automate the manufacturing process to a large degree and to make it inexpensive.

8 Claims, 1 Drawing Sheet

ELECTRICAL CONTROL DEVICE WITH METAL-COATED PLASTIC HOUSING

Cross-reference to related patent and application, the disclosures with which are hereby incorporated by reference: U.S. Pat. No. 4,495,232, BAUSER et al./I-RION & VOSSELER GmbH & Co.; U.S. Ser. No. 07/920,382, SEIPLER/BOSCH, filed AUG. 17, 1992, corresponding to DE-OS 40 05 113 A1, published AUG. 22, 1991.

FIELD OF THE INVENTION

The invention relates to an electrical control device an electrical circuit are housed, and of a housing of plastic with a plug integrated therewith.

BACKGROUND

In a known control device in practical use, the housing consisting of plastic with injection-molded plugs is placed on an aluminum base plate. A hybrid circuit is disposed on the base plate. A pressed screen is injection-molded into the housing of the plug strip for connecting this hybrid circuit with the plugs. One end of this pressed screen is soldered or riveted to the plug pins. The other end of the pressed screen extends out of the body of the plug strip and is connected with the hybrid circuit by means of bonded connections. Warping of the plastic body of the plug can be caused by the injection-molded pressed screen. Furthermore, manufacture of the housing is relatively expensive because of the injection-molded pressed elements and the soldered connection.

THE INVENTION

In contrast thereto, the control device of the invention has the advantage that the injection-molded pressed screen is replaced by a metal deposit on the plastic body. Because of this, simple and rapid manufacture is possible in a suitable way, particularly for mass production. Since it is possible to avoid complicated insertion processes, which can hardly be performed by machine, during injection molding and to omit expensive pressed parts, the control device can be manufactured relatively inexpensively. By means of the design, the individual steps can now be performed automatically. It is possible in contrast to other metallic coating methods to bend one end of the coating in a simple manner, so that it is possible to attach a bonded or soldered connection for contacting the hybrid circuit from above, i.e. accessible from the exterior.

DRAWINGS

An exemplary embodiment of the invention is illustrated in the drawings and will be described in detail in the following description. The single drawing figure shows a longitudinal sectional view of a control device.

DETAILED DESCRIPTION

Figure 1:
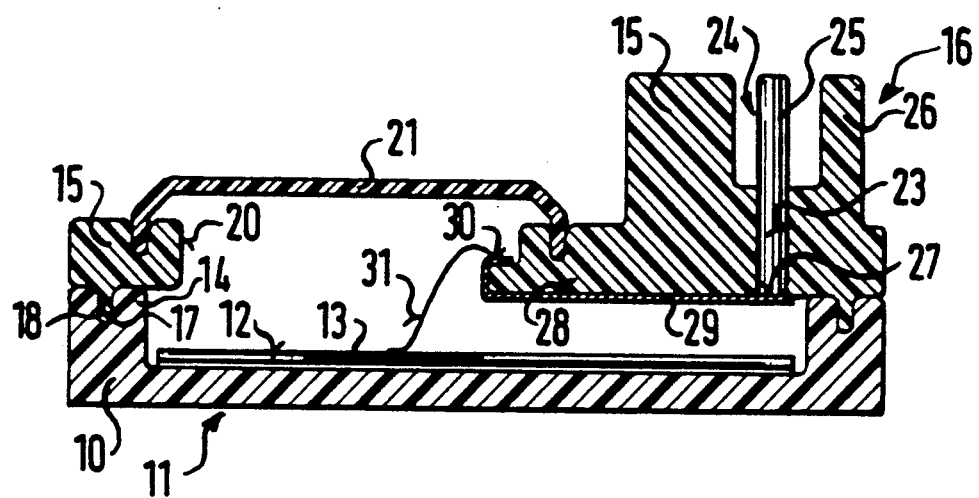

The base plate of a control device 11 made, for example, of aluminum, is indicated by 10 in the drawing figure. A hybrid circuit 13, not shown in detail, is disposed on the bottom 12 of this base plate 10. However, it is also possible to employ an arbitrary electrical circuit in place of a hybrid circuit. A housing 15 with integrated plugs 16 is placed on the edge 14 of the base plate 10 and sealingly glued. For this, a spring 17 extends into a groove 18, formed in the edge 14 of the base plate 10 and filled with an adhesive. The housing 15 consists of an electrically insulating plastic. The housing 15 also has an opening 20 covered by a lid 21. Furthermore, plug connectors 24 have been sealingly placed in through-bores 23 of the housing 15. In this case the plug connectors 24 extend with their plug sections 25 into the receiving body 26 for counter-plugs, not shown. The other end 27 of the plug connectors 24 terminates approximately flush with the interior wall, i.e. on the interior wall 28 of the housing 15 facing the bottom 12, and is connected there with the strip conductors 29. But the strip conductors 29 can also be pulled into the bore 23 and connected there with the plug connector 24. With this embodiment no flush termination of the plug connectors is necessary. The strip conductors 29 are guided along the interior wall 28 of the housing 15 and are bent over a short section 30 out of the opening 20. Contact with a bonded connection 31 is made in this area 30, which provides a connection from the strip conductor 29 to the hybrid circuit 13. The area 30 must be accessible from above for making a simple connection with this bonded connector 31, so that it is accessible through the opening 20 if the lid 21 has not yet been placed on it. In place of a bonded connection it is also possible to use any other, conventionally known type of connection, for example a soldered connection.

However, the application of the strip conductors 29 on the interior wall 28 of the housing 15, made of plastic, of the plugs is essential. In connection with this deposition process it is important that the plug connector 24 can be threaded through the bore 20 and the strip conductors 29 can be applied to the plastic as well as the metallic plug connectors 24 and connected with them. It is furthermore possible to bend the strip conductors 29 in the direction of the area 20 or to coat them diagonally across, so that a simple connection of the bonded connection 31 from above is possible. Novel deposition processes can be used for applying the strip conductors 29 to the interior wall 28. The laser-assisted deposition process (LAD process) of the firm Kammerer GmbH, D-7530 Pforzheim-Huchenfeld (Fed. Rep. of Germany) can be used. This is a laser-assisted deposition process for ultra-fine conductor metallizing. The most important individual steps of this deposition process are as follows: In the course of so-called pre-treatment, the interior wall 28 of the receiving body 15 is cleaned and pre-treated in chemical and physical processes to attain a high degree of adhesiveness. Subsequently, a thin, palladium-containing film is created on the surface, which is then dried. This palladium is used for catalyzing in the subsequent currentless metallization process. A mask is placed on it in addition, the shape of which corresponds to the desired printed circuit. The palladium-containing film is selectively decomposed by means of subsequent exposure to UV laser radiation from an excimer laser (for example at lambda=248 nm). In the course of this, palladium atoms are freed. Alternatively to or in combination with the above described masking process, it is also possible to operate by direct writing with a focussed laser beam. Higher flexibility is achieved by this. The subsequent currentless metallization process is selectively employed only where the laser beam impacts.

It would furthermore also be possible to apply the strip conductors 29 with the aid of the so-called molded interconnection device of the firm Metalstampa s.p.A., Via Valle Cupa 19/20 64010 Controguerra (Italy). Here, an injection-molded part is produced with a raised layout in the so-called mold'n plate process from catalyzed plastic. Subsequently a cast of normal plastic of the desired shape is produced. The catalyst of the first cast is activated. A chemical copper deposition on the catalyzed plastic is obtained by this. It would furthermore also be possible to operate here in accordance with the photosensitive process. The injection-molded part is dipped into a chemical solution and a layout is produced with the help of a rigid mask. The mask is again subsequently exposed to UV radiation. In this way a chemical copper deposit is attained on the radiated portions, which represent the strip conductors 29.

Furthermore, the Ivonding ®-process of the firm IVO IRON & Vosseler GmbH & Co., D7730 Villingen-Schwenningen (Fed. Rep. of Germany) has proven to be particularly advantageous. The Ivonding ®-process is a method for the rapid and economical application of electrically-conductive copper strips on thermoplastic materials. Here, a conductive hot-stamping foil, for example a foil commercially available under the name Ivotape ®, is applied to a plastic body. The Ivotape ® hot-stamping foil, for example known from European Patent Disclosure EP-B1 0 006 334, BROWN+-/MOBIL and corresponding U.S. Pat. No. 4,482,673, or U.S. Pat. No. 4,495,232, BAUSER et al., is a hot-stamping foil consisting of a special copper foil and a substrate. The underside of the copper foil is provided with an adhesive layer. Because of this, a solid connection of the strip conductors with the plastic body is possible. The structure of the stamping foil consists of a substrate, a separation layer, a copper foil and the adhesive layer already mentioned above. This stamping foil is applied to a previously cleaned surface of the body. A stamping pattern corresponding to the strip conductors is already present in the plastic body. A pattern corresponding thereto, a so-called steel printing block, is located on a heated die. The stamping foil is now pressed on the plastic body by means of this die. The strip conductors are sheared off and simultaneously glued to the plastic body. After the reverse stroke of the die, the remaining unused foil is completely pulled off the plastic body by the carrier tape, so that only the desired strip conductors remain.

Various changes and modifications may be made, and features described in connection with any one of the embodiments may be used with any of the others, within the scope of the inventive concept.

I claim:

1. An electrical control device (11) with
    a base plate (10) adapted to support electrical components of an electrical circuit (13), and a housing (15) of plastic with a plug (16) integrated therewith, said base plate (10) and said housing (15) being interengaged (17,18) to define an interior space therebetween;
    wherein said housing (15) has an interior wall or surface (28) adjacent said interior space and an exterior wall or surface, and is formed with an opening (20), along a peripheral edge of which said interior and exterior surfaces meet;
    said housing (15) is formed with a plurality of through-bores (23) which receive respective plug connectors (24) of the plug (16);
    an elongated metal deposit, having at least two ends, is applied on the interior wall (28) of the housing (15), thereby defining a strip conductor (29);
    this deposit (29) is connected with the plug connectors (24);
    and one of the ends of the metal deposit (29) extends across said peripheral edge of said opening (20), thereby defining an electrical contact area (30) on said exterior wall of said housing (15).

2. An electrical control device in accordance with claim 1,
    further comprising
    an electrical conductor (31) extending from the electrical circuit (13) to the electrical contact area (30) of said metal deposit (29).

3. An electrical control device in accordance with claim 2, wherein
    said electrical conductor (31) is a bonding wire.

4. An electrical control device in accordance with claim 1,
    wherein
    the deposit (29) extends into at least one throughbore (23) in which one of said lug connectors (24) is disposed.

5. An electrical control device in accordance with claim 1,
    wherein
    the deposit (29) and the plug connectors (24) terminate flush at the interior wall (28) of the housing (15) adjacent said plug (16).

6. An electrical control device in accordance with claim 1,
    wherein
    the deposit (29) is produced in accordance with a Laser-Assisted Deposition process.

7. An electrical control device in accordance with claim 1,
    wherein
    the deposit (29) is produced in accordance with a Molded Interconnection Device process.

8. An electrical control device in accordance with claim 1,
    wherein
    the deposit (29) is produced by hot-stamping onto a thermoplastic a copper foil having on its underside and adhesive layer activatable by compression.

* * * * *